United States Patent
Chan et al.

(10) Patent No.: US 6,656,796 B2
(45) Date of Patent: Dec. 2, 2003

(54) MULTIPLE ETCH METHOD FOR FABRICATING SPLIT GATE FIELD EFFECT TRANSISTOR (FET) DEVICE

(75) Inventors: Bor-Wen Chan, Hsin Chu (TW); Yu-I Wang, Taichung (TW); Chen-Yuan Hsu, Hsin Chu (TW); Hun-Jan Tao, Hsin Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 10/047,378

(22) Filed: Jan. 14, 2002

(65) Prior Publication Data

US 2003/0134435 A1 Jul. 17, 2003

(51) Int. Cl.[7] .................. H01L 21/336; H01L 21/3205; H01L 31/4763
(52) U.S. Cl. ................. 438/266; 438/267; 438/304; 438/305; 438/593; 438/594; 438/595; 438/596
(58) Field of Search ................... 438/266, 267, 438/304, 305, 593, 594, 595, 596

(56) References Cited

U.S. PATENT DOCUMENTS

| | | | | |
|---|---|---|---|---|
| 5,075,245 A | | 12/1991 | Woo et al. | |
| 5,714,412 A | * | 2/1998 | Liang et al. | 438/266 |
| 5,789,297 A | * | 8/1998 | Wang et al. | 438/267 |
| 5,874,337 A | * | 2/1999 | Geissler | 438/259 |
| 5,970,341 A | * | 10/1999 | Lin et al. | 438/257 |
| 6,087,211 A | * | 7/2000 | Kalnitsky et al. | 438/232 |
| 6,090,668 A | * | 7/2000 | Lin et al. | 438/266 |
| 6,093,608 A | | 7/2000 | Lin et al. | |
| 6,117,733 A | * | 9/2000 | Sung et al. | 438/265 |
| 6,171,908 B1 | * | 1/2001 | Chen | 438/266 |
| 6,180,461 B1 | * | 1/2001 | Ogura | 438/266 |
| 6,380,035 B1 | * | 4/2002 | Sung et al. | 438/264 |

* cited by examiner

Primary Examiner—Wael Fahomy
Assistant Examiner—Shrinivas H. Rao
(74) Attorney, Agent, or Firm—Tung & Associates

(57) ABSTRACT

Within a method for fabricating a split gate field effect transistor (FET) device there is employed a two step etch method for forming a floating gate electrode. Within the two step etch method there is employed a patterned first masking layer and a blanket second masking layer to assist in providing the floating gate electrode with a sharply pointed tip within at least either an upper edge of the floating gate electrode or sidewall of the floating gate electrode. The sharply pointed tip provides the split gate field effect transistor (FET) device with enhanced data erasure performance.

14 Claims, 2 Drawing Sheets

MULTIPLE ETCH METHOD FOR FABRICATING SPLIT GATE FIELD EFFECT TRANSISTOR (FET) DEVICE

BACKGROUND OF THE INVENTION

1. Field of the Invention

The present invention relates generally to methods for fabricating split gate field effect transistor (FET) devices, as employed within semiconductor integrated circuit microelectronic fabrications. More particularly, the present invention relates to methods for fabricating, with enhanced performance, split gate field effect transistor (FET) devices, as employed within semiconductor integrated circuit microelectronic fabrications.

2. Description of the Related Art

In addition to conventional semiconductor integrated circuit microelectronic fabrications having formed therein conventional field effect transistor (FET) devices and conventional bipolar junction transistor (BJT) devices whose transient operation provides for data storage and transduction capabilities within the conventional semiconductor integrated circuit microelectronic fabrications, there also exists within the art of semiconductor integrated circuit microelectronic fabrication non-volatile semiconductor integrated circuit microelectronic fabrications, and in particular non-volatile semiconductor integrated circuit microelectronic memory fabrications, such as but not limited to electrically erasable programable read only memory (EEPROM) non-volatile semiconductor integrated circuit microelectronic memory fabrications, whose data storage and transduction capabilities are not predicated upon transient operation.

Although non-volatile semiconductor integrated circuit microelectronic memory fabrications, such as but not limited to electrical erasable programmable read only memory (EEPROM) non-volatile semiconductor integrated circuit microelectronic memory fabrications, may be fabricated while employing any of several semiconductor integrated circuit microelectronic devices, a particularly common semiconductor integrated circuit microelectronic device employed within an electrically erasable programmable read only memory (EEPROM) non-volatile semiconductor integrated circuit microelectronic memory fabrication is a split gate field effect transistor (FET) device.

A split gate field effect transistor (FET) device is in part analogous in structure and operation with a conventional field effect transistor (FET) device insofar as a split gate field effect transistor (FET) device also comprises formed within a semiconductor substrate a channel region defined by a pair of source/drain regions also formed within the semiconductor substrate, wherein at least the channel region of the semiconductor substrate has formed thereupon a gate dielectric layer which separates a gate electrode from the channel region of the semiconductor substrate, but a split gate field effect transistor (FET) device is nonetheless distinguished from a conventional field effect transistor (FET) device by employing rather than a single gate electrode positioned upon the gate dielectric layer and completely covering the channel region of the semiconductor substrate: (1) a floating gate electrode positioned upon the gate dielectric layer (which in part serves as a tunneling dielectric layer) and covering over only a portion of the channel region defined by the pair of source/drain regions (such portion of the channel region also referred to as a floating gate electrode channel region); and (2) a control gate electrode positioned over the gate dielectric layer and covering a remainder portion of the channel region while at least partially covering and overlapping the floating gate electrode while being separated from the floating gate electrode by an inter-gate electrode dielectric layer (such remainder portion of the channel region also referred to as a control gate electrode channel region).

In order to effect operation of a split gate field effect transistor (FET) device, particular sets of voltages are applied to the control gate electrode, the source/drain regions and the semiconductor substrate in order to induce, reduce or sense charge within the floating gate electrode (which is otherwise fully electrically isolated) and thus provide conditions under which the floating gate electrode within the split gate field effect transistor (FET) device may be programmed, erased and/or read.

While split gate field effect transistor (FET) devices are thus desirable within the art of semiconductor integrated circuit microelectronic fabrication for providing semiconductor integrated circuit microelectronic fabrications with non-volatile data storage characteristics, split gate field effect transistor (FET) devices are nonetheless not entirely without problems in the art of semiconductor integrated circuit microelectronic fabrication.

In that regard, it is often difficult to efficiently form within non-volatile semiconductor integrated circuit microelectronic fabrications split gate field effect transistor (FET) devices with enhanced performance, such as in particular enhanced data erasure performance.

It is thus towards the goal of providing for use within semiconductor integrated circuit microelectronic fabrications, and in particular within semiconductor integrated circuit microelectronic memory fabrications, split gate field effect transistor (FET) devices with enhanced performance that the present invention is directed.

Various non-volatile semiconductor integrated circuit microelectronic devices having desirable properties, and methods for fabrication thereof, have been disclosed within the art of non-volatile semiconductor integrated circuit microelectronic fabrication.

Included among the non-volatile semiconductor integrated circuit microelectronic devices and methods for fabrication thereof, but not limited among the non-volatile semiconductor integrated circuit microelectronic devices and methods for fabrication thereof, are non-volatile semiconductor integrated circuit microelectronic devices and methods for fabrication thereof as disclosed within: (1) Woo et al., in U.S. Pat. No. 5,075,245 (a flash electrically programmable read only memory (EPROM) device with enhanced data erasure performance in part by forming the flash electrically programmable read only memory (EPROM) device with source and drain regions formed of asymmetric dimensions and beneath field oxide regions within the flash electrically programmable read only memory (EPROM) device); and (2) Lin et al., in U.S. Pat. No. 6,090,668 and U.S. Pat. No. 6,093,608 (a pair of split gate field effect transistor (FET) devices with enhanced data erasure performance by forming the pair of spilt gate field effect transistor (FET) devices with a pair of floating gates, each having a sharply pointed upper edge tip).

Desirable within the art of non-volatile semiconductor integrated circuit microelectronic fabrication, and in particular within the art of non-volatile semiconductor integrated circuit microelectronic memory fabrication, are additional methods and materials which may be employed for fabricating split gate field effect transistor (FET) devices with enhanced performance.

It is towards the foregoing object that the present invention is directed.

SUMMARY OF THE INVENTION

A first object of the present invention is to provide a method for fabricating a split gate field effect transistor (FET) device.

A second object of the present invention is to provide a method in accord with the first object of the present invention, wherein the split gate field effect transistor (FET) device is fabricated with enhanced performance.

A third object of the present invention is to provide a method in accord with the first object of the present invention and the second object of the present invention, wherein the method is readily commercially implemented.

In accord with the objects of the present invention, there is provided by the present invention a method for fabricating a split gate field effect transistor (FET) device.

To practice the method of the present invention, there is first provided a semiconductor substrate having formed thereupon a blanket tunneling dielectric layer, in turn having formed thereupon a blanket floating gate electrode material layer, finally in turn having formed thereupon a patterned first masking layer. There is then partially etched the blanket floating gate electrode material layer, while employing the patterned first masking layer as an etch mask layer, to form a partially etched blanket gate electrode material layer comprising a mesa positioned beneath the patterned first masking layer and a pair of lower lying plateau regions separated by the mesa. There is then stripped the patterned first masking layer from the mesa. There is then formed upon the partially etched blanket gate electrode material layer, including the mesa and the pair of lower lying plateau regions, a blanket conformal second masking layer. There is then sequentially etched the blanket conformal second masking layer and the partially etched blanket floating gate electrode material layer to form a patterned floating gate electrode having a pointed tip at its upper edge. There is then formed upon the patterned floating gate electrode an inter-gate electrode dielectric layer. Finally, there is then formed upon the inter-gate electrode dielectric layer and partially overlapping the patterned floating gate electrode a control gate electrode.

Within the present invention, the patterned floating gate electrode may alternatively or additionally have a pointed tip contained within a sidewall of the patterned floating gate electrode.

Similarly, the method of the present invention contemplates a split gate field effect transistor (FET) device structure fabricated in accord with the method of the present invention.

The present invention provides a method for fabricating within a semiconductor integrated circuit microelectronic fabrication, and in particular within a non-volatile semiconductor integrated circuit microelectronic memory fabrication, a split gate field effect transistor (FET) device, wherein the split gate field effect transistor (FET) device is fabricated with enhanced performance.

The present invention realizes the foregoing objects by employing when fabricating a patterned floating gate electrode within the split gate field effect transistor (FET) device a two-step etch method, in conjunction with a patterned first masking layer and a blanket second masking layer, such as to provide the patterned floating gate electrode with a sharply pointed tip located at least either: (1) at an upper edge of the patterned floating gate electrode; or (2) contained within a sidewall of the patterned floating gate electrode. By providing the patterned floating gate electrode with the sharply pointed tip located within at least either of the foregoing two locations, the split gate field effect transistor (FET) device is fabricated with enhanced performance, insofar as data stored within the split gate field effect transistor (FET) device may more readily be erased.

The method of the present invention is readily commercially implemented. A split gate field effect transistor (FET) device fabricated in accord with the present invention may be fabricated employing methods and materials as are generally known in the art of semiconductor integrated circuit microelectronic fabrication, including but not limited to non-volatile semiconductor integrated circuit microelectronic memory fabrication, but employed within the context of a novel ordering and sequencing of process steps to provide the method of the present invention. Since it is thus a novel ordering and sequencing of process steps which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating within a semiconductor integrated circuit microelectronic fabrication, and in particular within a non-volatile semiconductor integrated circuit microelectronic memory fabrication, a split gate field effect transistor (FET) device, wherein the split gate field effect transistor (FET) device is fabricated with enhanced performance.

The present invention realizes the foregoing objects by employing when fabricating a patterned floating gate electrode within the split gate field effect transistor (FET) device a two-step etch method, in conjunction with a patterned first masking layer and a blanket second masking layer, such as to provide the patterned floating gate electrode with a sharply pointed tip located at least either: (1) at an upper edge of the patterned floating gate electrode; or (2) contained within a sidewall of the patterned floating gate electrode. By providing the patterned floating gate electrode with the sharply pointed tip located within at least either of the foregoing two locations, the split gate field effect transistor (FET) device is fabricated with enhanced performance, insofar as data stored within the split gate field effect transistor (FET) device may more readily be erased.

A split gate field effect transistor (FET) device fabricated in accord with the present invention may be fabricated within a non-volatile semiconductor integrated circuit microelectronic fabrication such as but not limited to a non-volatile semiconductor integrated circuit microelectronic memory fabrication such as but not limited to an electrically erasable programmable read only memory (EEPROM) semiconductor integrated circuit microelectronic memory fabrication such as but not limited to a flash memory fabrication. Similarly, a split gate field effect transistor (FET) device in accord with the present invention may be fabricated as an N channel or a P channel split gate field effect transistor (FET) device.

Figure 1:
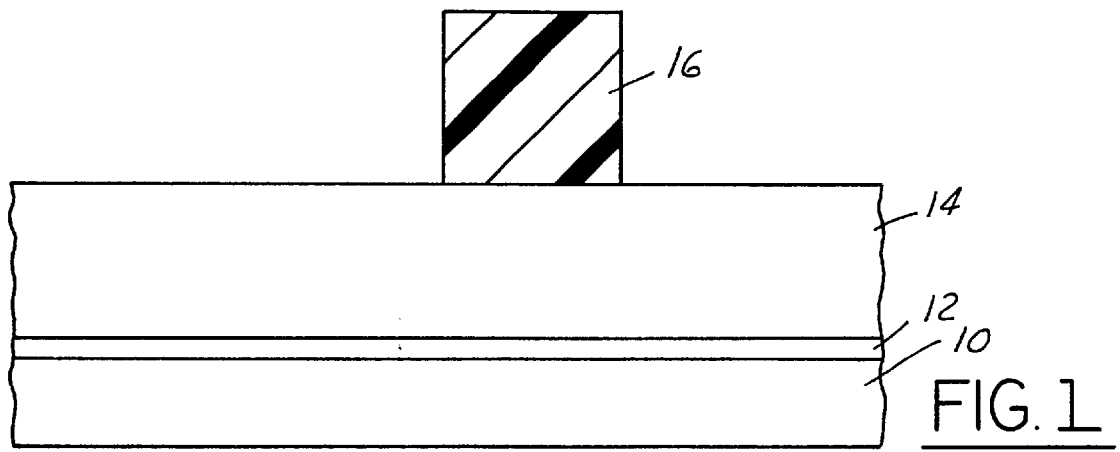
FIG. 1, FIG. 2, FIG. 3, FIG. 4, FIG. 5, FIG. 6 and FIG. 7 show a series of schematic cross-sectional diagrams illustrating the results of progressive stages of forming, in accord with a preferred embodiment of the present invention, a split gate field effect transistor (FET) device within a semiconductor integrated circuit microelectronic fabrication.

Referring now to FIG. 1 to FIG. 7, there is shown a series of schematic cross-sectional diagrams illustrating the results of progressive stages of fabricating, in accord with a preferred embodiment of the present invention, a split gate field effect transistor (FET) device within a semiconductor integrated circuit microelectronic fabrication. Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a semiconductor substrate 10 having formed thereupon a blanket tunneling dielectric layer 12, in turn having formed thereupon a blanket floating gate electrode material layer 14, finally in turn having formed thereupon a patterned first masking layer 16.

Within the preferred embodiment of the present invention, each of the foregoing semiconductor substrate 10, blanket tunneling dielectric layer 12, blanket gate electrode materials layer 14 and patterned first masking layer 16 may be formed employing methods and materials as are otherwise generally conventional in the art of semiconductor integrated circuit microelectronic fabrication, and in particular semiconductor integrated circuit microelectronic memory fabrication.

For example and without limitation, and although semiconductor substrates are known in the art of semiconductor integrated circuit microelectronic fabrication with either dopant polarity, various dopant concentrations and several crystallographic orientations, for the preferred embodiment of the present invention the semiconductor substrate 10 is typically and preferably a (100) silicon semiconductor substrate having either an N– or P– doping. Similarly, and also for example and without limitation, although tunneling dielectric layers are known in the art of semiconductor integrated circuit microelectronic fabrication to be formed from various dielectric materials, including but not limited to silicon oxide dielectric materials, silicon nitride dielectric materials and silicon oxynitride dielectric materials, for the preferred embodiment of the present invention, the blanket tunneling dielectric layer 12 is typically and preferably formed at least in part of a silicon oxide dielectric material formed to a thickness of from about 10 to about 100 angstroms upon the semiconductor substrate 10. Yet similarly, and also for example and without limitation, although blanket floating gate electrode material layers are known in the art of semiconductor integrated circuit microelectronic fabrication to be formed from floating gate electrode materials including but not limited to metal, metal alloy, doped polysilicon (having a dopant concentration of greater than about 1E18 dopant atoms per cubic centimeter) and polycide (doped polysilicon/metal silicide stack) floating gate electrode materials, for the preferred embodiment of the present invention, the blanket floating gate electrode material layer 14 is typically and preferably formed of a doped polysilicon floating gate electrode material formed to a thickness of from about 1000 to about 5000 angstroms upon the blanket tunneling dielectric layer 12. Finally, and also for example and also without limitation, although it is known in the art of semiconductor integrated circuit microelectronic fabrication that patterned masking layers may be formed from masking materials including but not limited to hard mask materials and photoresist mask materials, for the preferred embodiment of the present invention the patterned first masking layer 16 is typically and preferably formed of a photoresist mask material formed to a thickness of from about 2500 to about 10000 angstroms upon the blanket floating gate electrode material layer 14.

Figure 2:
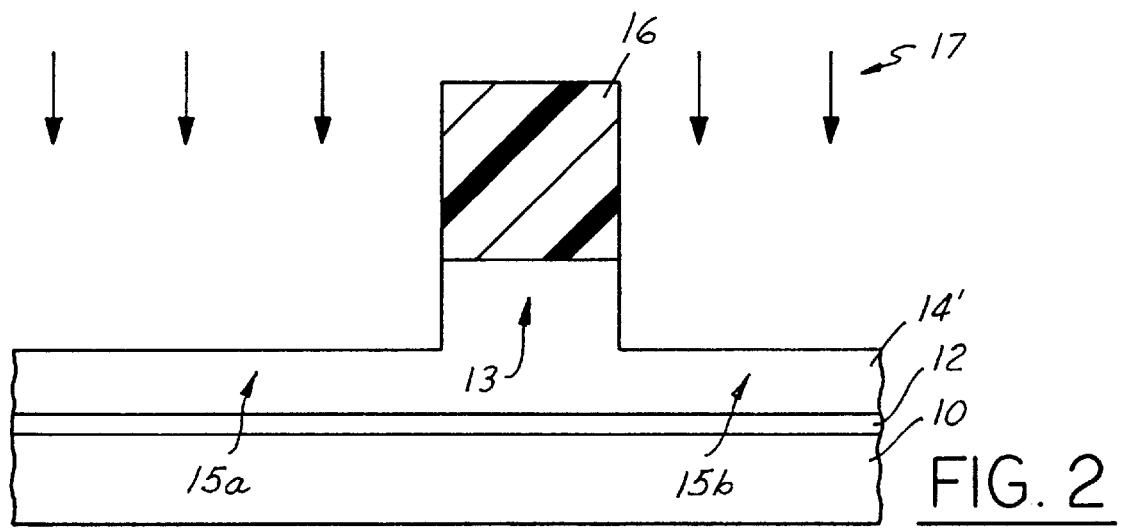

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the blanket floating gate electrode material layer 14 has been partially etched to form a partially etched blanket gate electrode material layer 14', while employing the patterned masking layer 16 as an etch mask layer, in conjunction with a first etching plasma 17.

Within the preferred embodiment of the present invention, the first etching plasma 17 is typically and preferably an anisotropic etching plasma which may be formed employing materials as are otherwise generally known in the art of semiconductor integrated circuit microelectronic fabrication. Similarly, it will typically and preferably employ a chlorine containing etchant gas composition, particularly under circumstances where the blanket floating gate electrode material layer 14 is formed at least in part of a doped polysilicon material. As is similarly also illustrated within the schematic cross-sectional diagram of FIG. 2, the partially etched blanket gate electrode material layer 14' has formed therein a mesa 13 beneath the patterned masking layer 16, as well as a pair of lower lying plateau regions 15a and 15b separated by the mesa 13 and not covered by the patterned masking layer 16. Typically and preferably, each of the pair of lower lying plateau regions 15a and 15b has a thickness of from about 300 to about 2500 angstroms upon the blanket tunneling dielectric layer 12, while the mesa 13 continues to have a thickness of from about 300 to about 2500 angstroms upon the blanket tunneling dielectric layer 12.

Figure 3:
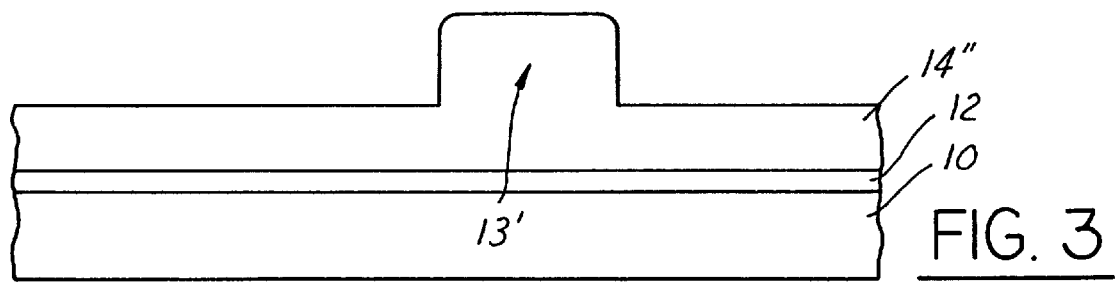

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, the patterned first masking layer 16 has been stripped from the partially etched blanket gate electrode material layer 14' at the location of the mesa 13, as illustrated within the schematic cross-sectional diagram of FIG. 2.

Within the preferred embodiment of the present invention, the patterned masking layer 16 may be stripped from the location of the mesa 13 within the partially etched blanket gate electrode material layer 14' while employing stripping methods and materials as are otherwise generally conventional in the art of semiconductor integrated circuit microelectronic fabrication.

Similarly, there is also shown within the schematic cross-sectional diagram of FIG. 3 the results of optionally rounding the corners of the mesa 13, to form a rounded mesa 13' within a further partially etched blanket floating gate electrode material layer 14".

Such optional rounding of the mesa 13 to form the rounded mesa 13' and further etching of the partially etched blanket gate electrode material layer 14' to form the further partially etched blanket gate electrode material layer 14" may be effected employing an isotropic etchant, such as but not limited to an isotropic plasma etchant (generally employing a chlorine containing etchant gas composition at a reactor chamber pressure of from about 50 to about 100 mTorr (in comparison with a reactor chamber pressure of from about 4 to about 20 mTorr which generally provides an anisotropic etchant plasma)) or an isotropic wet chemical etchant (such as a nitric acid/hydrofluoric acid aqueous etchant composition).

Figure 4:
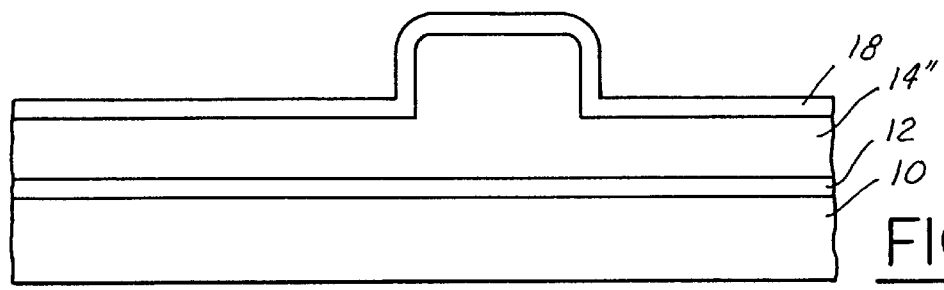

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein there is formed upon the further partially etched blanket floating gate electrode material layer 14" a blanket conformal second masking layer 18.

Within the preferred embodiment of the present invention, the blanket conformal second masking layer 18 may be formed from any of several masking materials as are conventional in the art of semiconductor integrated circuit microelectronic fabrication, and the blanket conformal second masking layer 18 will generally possess an enhanced etch specificity with respect to the floating gate electrode material from which is formed the further partially etched blanket floating gate electrode material layer 14". Typically and preferably, the blanket conformal second masking layer 18 is formed conformally (i.e., of a single thickness) of a silicon oxide masking material, although other masking materials may also be employed. Within the preferred embodiment of the present invention, the silicon oxide masking material may be formed extrinsically upon the further partially etched blanket gate electrode material layer 14", or in an alternative thermally grown upon the further partially etched blanket gate electrode material layer 14', when formed of a doped polysilicon floating gate electrode material. Typically and preferably, the blanket conformal second masking layer 18 is formed to a thickness of from about 100 to about 500 angstroms upon the further partially etched blanket gate electrode material layer 14".

Figure 5:
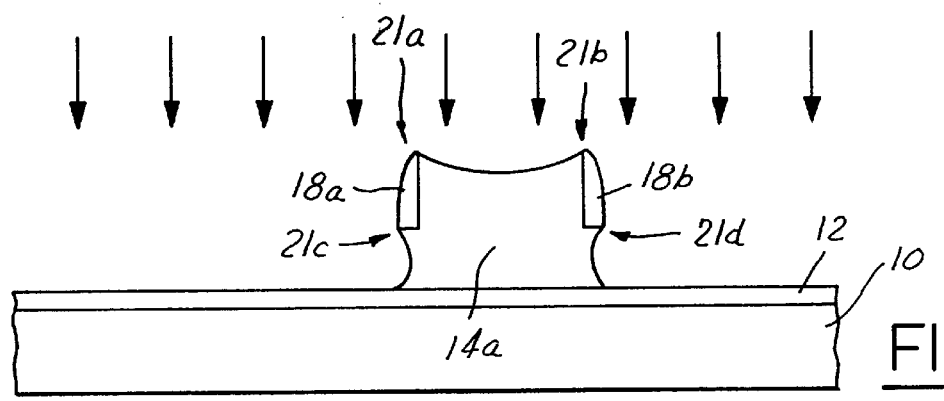

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there has been sequentially etched: (1) the blanket conformal second masking layer 18 to form a pair of patterned second masking layers 18a and 18b; and then (2) the further partially etched blanket floating gate electrode material layer 14" to form a floating gate electrode 14a, while employing at least in part a second etching plasma 19.

Within the preferred embodiment of the present invention, the sequential etching of the blanket conformal second masking layer 18 and the further partially etched blanket floating gate electrode material layer 14" may be undertaken with the second etching plasma 19 while employing plasma etch methods as are otherwise generally conventional in the art of semiconductor integrated circuit microelectronic fabrication. For purposes of etching the blanket conformal second masking layer 12 there will typically and preferably be employed a fluorine containing etchant gas composition, while for etching the further partially etched blanket floating gate electrode material layer 14" there will typically and preferably be employed a chlorine containing etchant gas composition. Similarly, with the preferred embodiment of the present invention, the further partially etched blanket gate electrode material layer 14" is etched such as to provide the patterned floating gate electrode 14a having at least either (and preferably both) a pair of pointed tips 21a and 21b at a pair of its upper edges, as well as a pair of pointed tips 21c and 21d contained within its pair of sidewalls. Within the present invention with respect to the pair of pointed tips 21c and 21d contained with the pair of sidewalls of the patterned floating gate electrode 14a, it is intended that the pair of pointed tips 21c and 21d is not located such as to include a pair of upper edges of the patterned floating gate electrode 14a or a pair of lower edges of the patterned floating gate electrode 14a. The series of pointed tips 21a, 21b, 21c and 21d may be effected by employing the second etching plasma 19 having in part isotropic characteristics (i.e., at a generally increased reactor chamber pressure of from about 50 to about 100 mTorr) with respect to the further partially etched blanket floating gate electrode material layer 14", or alternatively a wet chemical isotropic etchant with respect to the further partially etched blanket floating gate electrode material layer 14".

Figure 6:
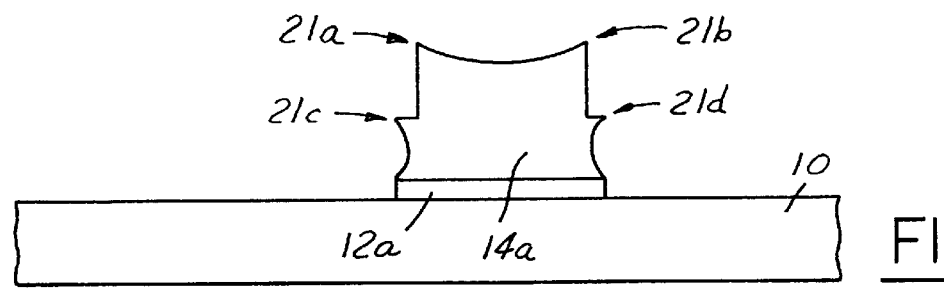

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein: (1) the pair of patterned second masking layers 18a and 18b has been stripped from the patterned floating gate electrode 14a; and (2) portions of the blanket tunneling dielectric layer 12 have been etched to form a patterned tunneling dielectric layer 12a coextensive with the patterned floating gate electrode 14a.

Within the preferred embodiment of the present invention: (1) the pair of patterned second masking layers 18a and 18b may be stripped from the patterned floating gate electrode 14a; and (2) the portions of the blanket tunneling dielectric layer 12 not covered by the patterned floating gate electrode 14a may be etched to form the patterned tunneling dielectric layer 12a, while employing etch methods as are otherwise generally conventional in the art of semiconductor integrated circuit microelectronic fabrication. Such etch methods may include, but are not limited to, aqueous hydrofluoric acid etch methods, under circumstances where both the pair of patterned second masking layers 18a and 18b and the blanket tunneling dielectric layer 12 are formed of a silicon oxide dielectric material.

Figure 7:
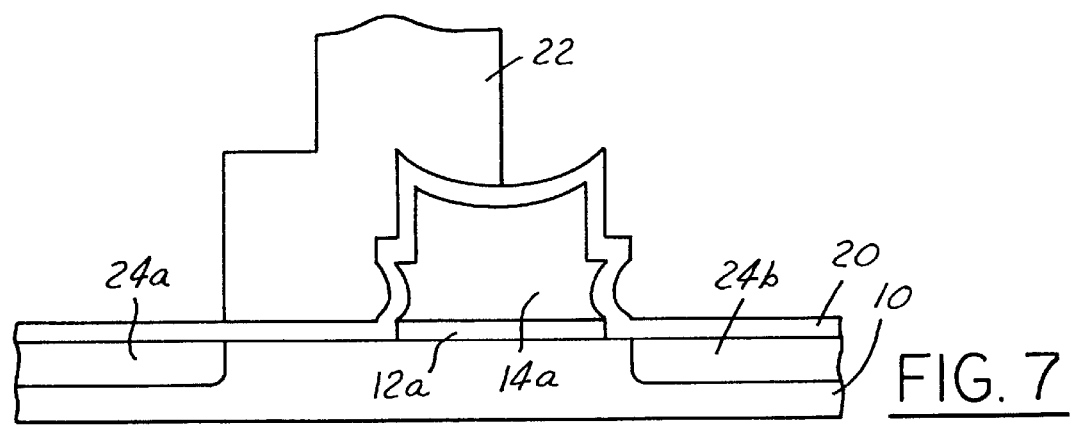

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein, in a first instance, there is formed upon exposed portions of the semiconductor substrate 10, the patterned tunneling dielectric layer 12a and the floating gate electrode 14a, a blanket inter-gate electrode dielectric layer 20.

Within the preferred embodiment of the present invention, the blanket inter-gate electrode dielectric layer 20 may be formed employing methods and materials as are otherwise generally conventional in the art of semiconductor integrated circuit microelectronic fabrication, including but not limited to silicon oxide dielectric materials, silicon nitride dielectric materials and silicon oxynitride dielectric materials. Typically and preferably, the blanket inter-gate electrode dielectric layer 20 is formed conformally to a thickness of from about 10 to about 100 angstroms.

Similarly, there is also shown within the schematic cross-sectional diagram of FIG. 7 a control gate electrode 22 formed upon the blanket inter-gate electrode dielectric layer 20 and partially overlapping the floating gate electrode 14a.

Within the preferred embodiment of the present invention, the control gate electrode 22 may be formed employing methods and materials as are conventional in the art of semiconductor integrated circuit microelectronic fabrication. Typically and preferably, the control gate electrode 22 is formed of a polysilicon material, formed to a thickness of from about 1000 to about 5000 angstroms.

Finally, there is also shown within the schematic cross-sectional diagram of FIG. 7, and formed into the semiconductor substrate 10 while employing the control gate electrode 22, the blanket inter-gate electrode dielectric layer 20 and the floating gate electrode 14a as a mask, a pair of source/drain regions 24a and 24b.

Within the preferred embodiment of the present invention, the pair of source/drain regions 24a and 24b may be formed employing methods as are conventional in the art of semiconductor integrated circuit microelectronic fabrication. Typically and preferably, each of the pair of source/drain regions 24a and 24b is formed employing an ion implant method of appropriate dopant polarity, at an ion implant dose of from about 1E14 to about 5E17 dopant ions per square centimeter and an ion implantation energy of from about 10 to about 100 kev.

Upon forming within the semiconductor integrated circuit microelectronic fabrication whose schematic cross-sectional diagram is illustrated in FIG. 7 the split gate field effect transistor (FET) device in accord with the schematic cross-sectional diagram of FIG. 7, there is provided a split gate field effect transistor (FET) device in accord with the preferred embodiment of the present invention. The split gate field effect transistor (FET) device has enhanced performance insofar as the split gate field effect transistor has a floating gate electrode formed with a sharply pointed tip located at least either: (1) at an upper edge of the patterned floating gate electrode; or (2) contained within a sidewall of the patterned floating gate electrode.

As is understood by a person skilled in the art, the preferred embodiment of the present invention is illustrative of the present invention rather than limiting of the present invention. Revisions and modifications may be made to methods, structures and dimensions through which is provided within a semiconductor integrated circuit microelectronic fabrication a split gate field effect transistor (FET) device in accord with the preferred embodiment of the present invention while still providing within a semiconductor integrated circuit microelectronic fabrication a split gate field effect transistor (FET) device, and a method for fabrication thereof, in accord with the present invention, further in accord with the accompanying claims.

What is claimed is:

1. A method for fabricating a split gate field effect transistor device comprising:

providing a semiconductor substrate having formed thereupon a blanket tunneling dielectric layer, in turn having formed thereupon a blanket floating gate electrode material layer, finally in turn having formed thereupon a patterned first masking layer;

partially etching the blanket floating gate electrode material layer, while employing the patterned first masking layer as an etch mask layer, to form a partially etched blanket floating gate electrode material layer comprising a mesa positioned beneath the patterned first masking layer and a pair of lower lying plateau regions separated by the mesa;

stripping the patterned first masking layer from the mesa;

forming upon the partially etched blanket floating gate electrode material layer, including the mesa and the pair of lower lying plateau regions, a blanket conformal second masking layer;

sequentially etching the blanket conformal second masking layer and the partially etched blanket floating gate electrode material layer to form a floating gate electrode having a pointed tip at its upper edge;

forming upon the floating gate electrode an inter-gate electrode dielectric layer; and forming upon the inter-gate electrode dielectric layer and partially overlapping the floating gate electrode a control gate electrode.

2. The method of claim 1 wherein the split gate field effect transistor device is an N channel split gate field effect transistor device.

3. The method of claim 1 wherein the split gate field effect transistor device is a P channel split gate field effect transistor device.

4. The method of claim 1 wherein the floating gate electrode also has a pointed tip formed contained within its sidewall.

5. The method of claim 1 further comprising forming a pair of source/drain regions within the semiconductor substrate, the pair of source/drain regions being separated by the control gate electrode and the floating gate electrode.

6. A method for fabricating a split gate field effect transistor device comprising:

providing a semiconductor substrate having formed thereupon a blanket tunneling dielectric layer, in turn having formed thereupon a blanket floating gate electrode material layer, finally in turn having formed thereupon a patterned first masking layer;

partially etching the blanket floating gate electrode material layer, while employing the patterned first masking layer as an etch mask layer, to form a partially etched blanket floating gate electrode material layer comprising a mesa positioned beneath the patterned first masking layer and a pair of lower lying plateau regions separated by the mesa;

stripping the patterned first masking layer from the mesa;

forming upon the partially etched blanket floating gate electrode material layer, including the mesa and the pair of lower lying plateau regions, a blanket conformal second masking layer;

sequentially etching the blanket conformal second masking layer and the partially etched blanket floating gate electrode material layer to form a floating gate electrode having a pointed tip contained within its sidewall;

forming upon the floating gate electrode an inter-gate electrode dielectric layer; and forming upon the inter-gate electrode dielectric layer and partially overlapping the floating gate electrode a control gate electrode.

7. The method of claim 6 wherein the split gate field effect transistor device is an N channel split gate field effect transistor device.

8. The method of claim 6 wherein the split gate field effect transistor device is a P channel split gate field effect transistor device.

9. The method of claim 6 wherein the floating gate electrode also has a pointed tip formed at its upper edge.

10. The method of claim 6 further comprising forming a pair of source/drain regions within the semiconductor substrate, the pair of source/drain regions being separated by the control gate electrode and the floating gate electrode.

11. A method for fabricating a split gate field effect transistor device comprising:

providing a semiconductor substrate having formed thereupon a blanket tunneling dielectric layer, in turn having formed thereupon a blanket floating gate electrode material layer, finally in turn having formed thereupon a patterned first masking layer;

partially etching the blanket floating gate electrode material layer, while employing the patterned first masking layer as an etch mask layer, to form a partially etched blanket floating gate electrode material layer comprising a mesa positioned beneath the patterned first masking layer and a pair of lower lying plateau regions separated by the mesa and not covered by the patterned first masking layer;

stripping the patterned first masking layer from the mesa;

forming upon the partially etched blanket floating gate electrode material layer, including the mesa and the pair of lower lying plateau regions, a blanket conformal second masking layer;

sequentially etching the blanket conformal second masking layer and the partially etched blanket floating gate electrode material layer to form a floating gate electrode having a pointed tip at its upper edge;

forming upon the floating gate electrode an inter-gate electrode dielectric layer; and forming upon the inter-gate electrode dielectric layer and partially overlapping the floating gate electrode a control gate electrode.

12. The method of claim 1 wherein the floating gate electrode also has a pointed tip formed contained within its sidewall.

13. A method for fabricating a split gate field effect transistor device comprising:

providing a semiconductor substrate having formed thereupon a blanket tunneling dielectric layer, in turn having formed thereupon a blanket floating gate electrode material layer, finally in turn having formed thereupon a patterned first masking layer;

partially etching the blanket floating gate electrode material layer, while employing the patterned first masking layer as an etch mask layer, to form a partially etched blanket floating gate electrode material layer comprising a mesa positioned beneath the patterned first masking layer and a pair of lower lying plateau regions separated by the mesa and not covered by the patterned first masking layer;

stripping the patterned first masking layer from the mesa;

forming upon the partially etched blanket floating gate electrode material layer, including the mesa and the pair of lower lying plateau regions, a blanket conformal second masking layer;

sequentially etching the blanket conformal second masking layer and the partially etched blanket floating gate electrode material layer to form a floating gate electrode having a pointed tip contained within its sidewall;

forming upon the floating gate electrode an inter-gate electrode dielectric layer; and forming upon the inter-gate electrode dielectric layer and partially overlapping the floating gate electrode a control gate electrode.

14. The method of claim 6 wherein the floating gate electrode also has a pointed tip formed at its upper edge.

* * * * *